(12) United States Patent
Hirano et al.

(10) Patent No.: US 11,430,630 B2
(45) Date of Patent: Aug. 30, 2022

(54) CHARGED PARTICLE BEAM APPARATUS

(71) Applicant: Hitachi High-Technologies Corporation, Tokyo (JP)

(72) Inventors: Ryo Hirano, Tokyo (JP); Tsunenori Nomaguchi, Tokyo (JP); Chisato Kamiya, Tokyo (JP); Junichi Katane, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 387 days.

(21) Appl. No.: 16/641,035

(22) PCT Filed: Sep. 4, 2017

(86) PCT No.: PCT/JP2017/031788
§ 371 (c)(1),
(2) Date: Feb. 21, 2020

(87) PCT Pub. No.: WO2019/043945
PCT Pub. Date: Mar. 7, 2019

(65) Prior Publication Data
US 2020/0219697 A1    Jul. 9, 2020

(51) Int. Cl.
*H01J 37/28* (2006.01)
*H01J 37/141* (2006.01)
(Continued)

(52) U.S. Cl.
CPC .......... *H01J 37/28* (2013.01); *H01J 37/1413* (2013.01); *H01J 37/20* (2013.01); *H01J 37/3005* (2013.01); *H01J 2237/141* (2013.01)

(58) Field of Classification Search
None
See application file for complete search history.

(56) References Cited

U.S. PATENT DOCUMENTS

| 6,452,172 B1 | 9/2002 | Oi |
| 2003/0089859 A1* | 5/2003 | Adamec ............... H01J 37/141 250/398 |

(Continued)

FOREIGN PATENT DOCUMENTS

| CZ | 306807 B6 * | 7/2017 | .............. H01J 37/04 |
| CZ | 201600300 A3 * | 7/2017 | .............. H01J 37/04 |

(Continued)

OTHER PUBLICATIONS

International Search Report (PCT/ISA/210) issued in PCT Application No. PCT/JP2017/031788 dated Nov. 7, 2017 with English translation (two (2) pages).

(Continued)

*Primary Examiner* — Andrew Smyth
(74) *Attorney, Agent, or Firm* — Crowell & Moring LLP

(57) ABSTRACT

The present invention realizes a composite charged particle beam apparatus capable of suppressing a leakage magnetic field from a pole piece forming an objective lens of an SEM with a simple structure. The charged particle beam apparatus according to the present invention obtains an ion beam observation image while passing a current to a first coil constituting the objective lens, and performs an operation of reducing the image shift by passing a current to a second coil with a plurality of current values, and determines a current to be passed to the second coil based on a difference between the operations.

13 Claims, 7 Drawing Sheets

(51) Int. Cl.
*H01J 37/20* (2006.01)
*H01J 37/30* (2006.01)

(56) References Cited

U.S. PATENT DOCUMENTS

| | | | |
|---|---|---|---|
| 2008/0121810 A1* | 5/2008 | Liu | H01J 37/28 |
| | | | 250/396 ML |
| 2009/0159810 A1 | 6/2009 | Knippelmeyer et al. | |
| 2010/0301211 A1 | 12/2010 | Miller | |
| 2017/0338078 A1* | 11/2017 | Jiruse | H01J 37/263 |
| 2020/0090903 A1* | 3/2020 | Hirano | H01J 37/28 |

FOREIGN PATENT DOCUMENTS

| | | | | |
|---|---|---|---|---|
| EP | 1120809 A1 * | 8/2001 | | H01J 37/141 |
| JP | 5-225936 A | 9/1993 | | |
| JP | 11-329331 A | 11/1999 | | |
| JP | 2009-517816 A | 4/2009 | | |
| JP | 2010-278004 A | 12/2010 | | |
| WO | WO-2018179115 A1 * | 10/2018 | | H01J 37/04 |
| WO | WO-2019043946 A1 * | 3/2019 | | H01J 37/09 |

OTHER PUBLICATIONS

Japanese-language Written Opinion (PCT/ISA/237) issued in PCT Application No. PCT/JP2017/031788 dated Nov. 7, 2017 (three (3) pages).

* cited by examiner

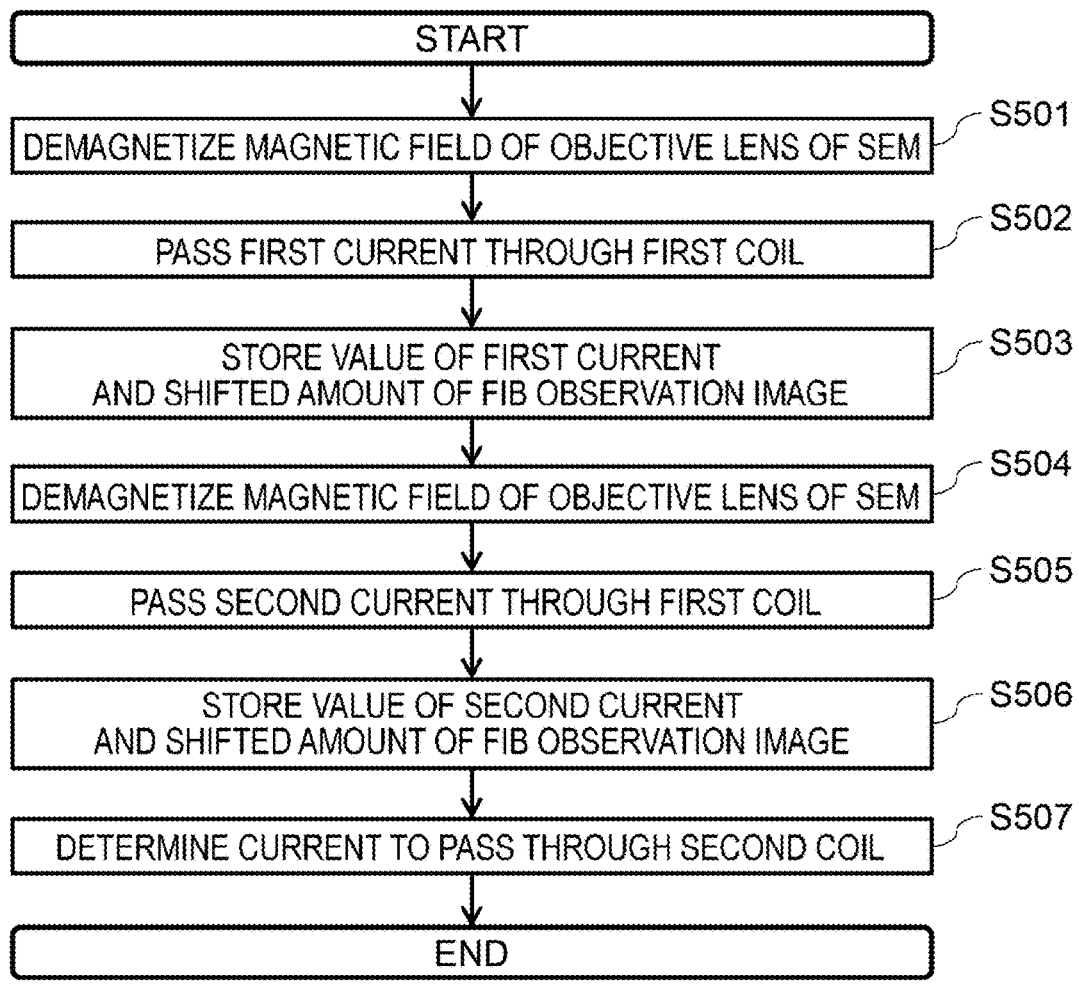
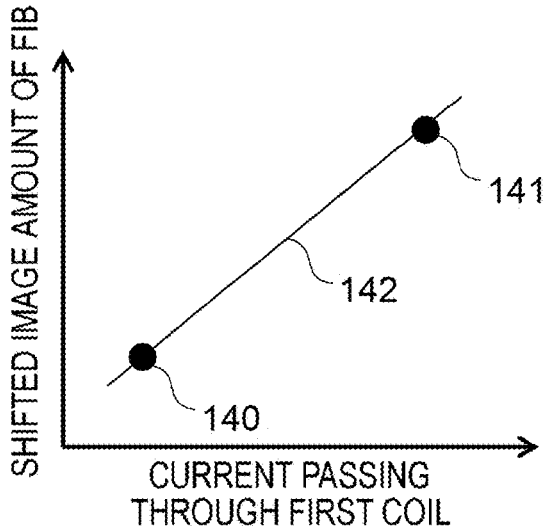
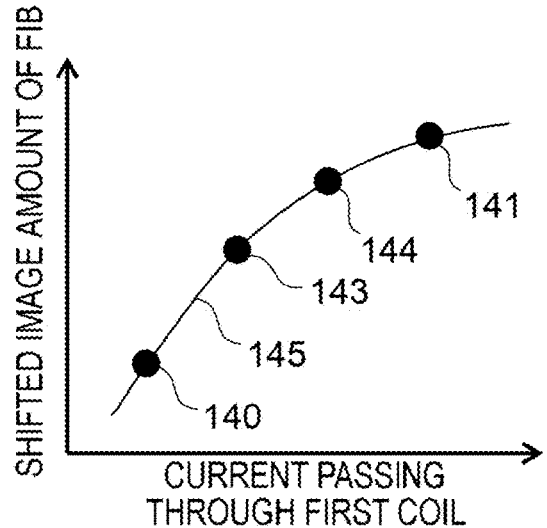

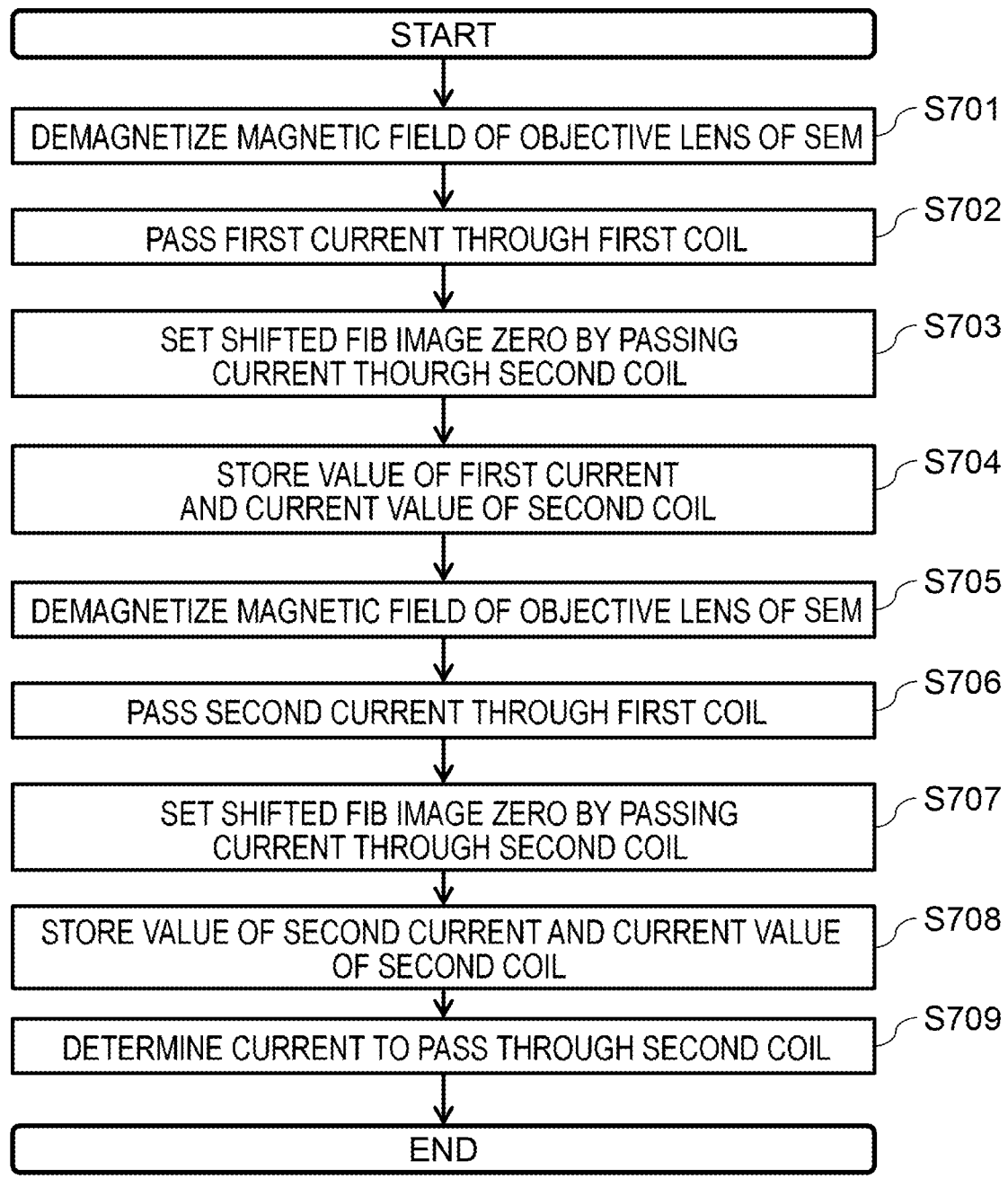

CHARGED PARTICLE BEAM APPARATUS

TECHNICAL FIELD

The present invention relates to a charged particle beam apparatus.

BACKGROUND ART

An FIB-SEM apparatus is a composite charged particle beam apparatus in which a focused ion beam (FIB) irradiation unit and a scanning electron microscope (SEM) are disposed in the same specimen chamber. The FIB-SEM apparatus is used for preparing a thin film specimen to be observed by using a transmission electron microscope and analyzing a three-dimensional structure of the specimen. Since the SEM has a smaller probe beam diameter than the FIB, the specimen can be observed with high resolution.

The FIB-SEM apparatus performs processing by FIB and observation by SEM alternately or simultaneously. At this time, if a magnetic field leaks from an SEM objective lens to the FIB-SEM specimen chamber, an FIB ion beam is deflected or the isotopes of an ion source are separated, thereby deteriorating the processing accuracy and resolution.

JP-A-11-329331 (PTL 1) below describes a composite charged particle beam apparatus. The document discloses a technique of "a combined charged particle beam system provided with a focused ion beam column, an electron beam column, and a magnetic field measuring instrument in the same specimen chamber, and measures the residual magnetism in the specimen chamber and having a function of controlling the magnetic field on the trajectory of the focused ion beam by using an electromagnetic method" as a challenge of "preventing mass separation of a focused ion beam due to residual magnetic field and improving reproducibility and stability of focusing an electron beam" (see abstract).

CITATION LIST

Patent Literature

PTL 1: JP-A-11-329331

SUMMARY OF INVENTION

Technical Problem

In addition to FIB processing and SEM observation, an analyzer for performing various analyses such as energy dispersive X-ray spectrometry (EDS) and electron backscatter diffraction (EBSD) is installed in the specimen chamber. Therefore, it may be difficult to secure a space for mounting a magnetic field detector as in JP-A-11-329331 (PTL 1) in the specimen chamber.

The present invention has been made in view of the above-described problem, and realizes a composite charged particle beam apparatus capable of suppressing a leakage magnetic field from a pole piece forming an objective lens of an SEM with a simple structure.

Solution to Problem

The charged particle beam apparatus according to the present invention performs operations of acquiring an ion beam observation image while passing a current to a first coil constituting the objective lens with a plurality of current values, and reduces a positional shift of the observation image by passing a current to a second coil based on a difference between the operations.

Advantageous Effects of Invention

According to the charged particle beam apparatus of the present invention, it is possible to suppress the shift of the focused ion beam without measuring the magnetic field in the specimen chamber. Therefore, it is not necessary to dispose a magnetic field measuring instrument in the specimen chamber, thus the apparatus configuration can be simplified.

BRIEF DESCRIPTION OF DRAWINGS

FIG. 5 is a flowchart showing a procedure for determining a value of a current to be passed to a second coil 113 in order to suppress a leakage magnetic field.

FIGS. 6A and 6B are graphs showing a correspondence between the current that is passed to a first coil 112 and an FIB image shift amount.

FIG. 7 is a flowchart showing the procedure in which a charged particle beam apparatus 10 according to Embodiment 2 suppresses a leakage magnetic field by passing a current to the second coil 113.

DESCRIPTION OF EMBODIMENTS

Embodiment 1

Figure 1:
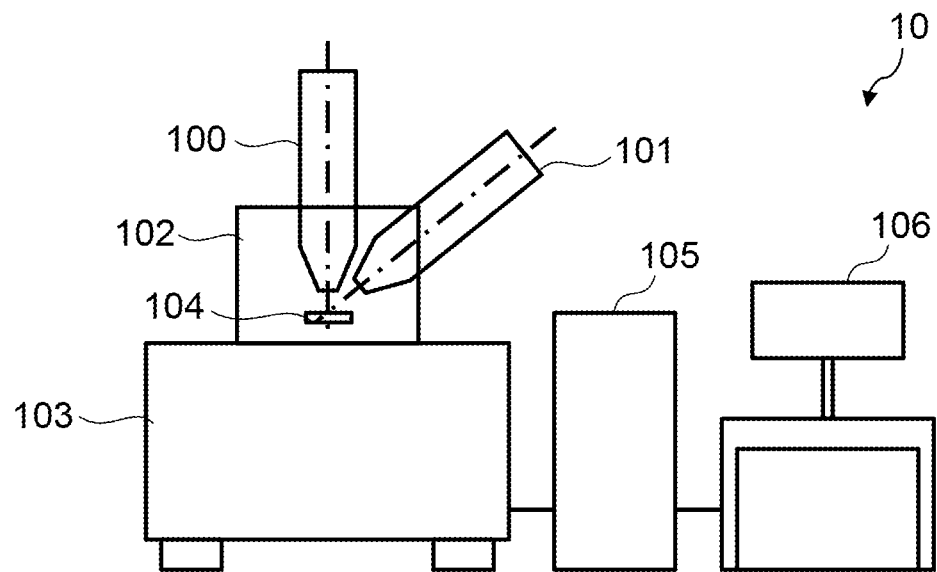
FIG. 1 is a configuration diagram of a charged particle beam apparatus 10 according to Embodiment 1.

FIG. 1 is a configuration diagram of the charged particle beam apparatus 10 according to Embodiment 1 of the present invention. The charged particle beam apparatus 10 is configured as an FIB-SEM apparatus. The charged particle beam apparatus 10 includes the SEM column 100, an FIB column 101, a specimen chamber 102, an FIB-SEM frame 103, a controller 105, and a monitor 106. The FIB column 101 irradiates a specimen 104 with FIB in order to process or observe the specimen 104. The SEM column 100 irradiates the specimen 104 with an electron beam in order to observe and analyze the specimen 104 with high resolution. The specimen chamber 102 is a space in which the specimen 104 is installed, and includes the above-described lens columns. The FIB-SEM frame 103 is equipped with the specimen chamber 102. The controller 105 controls the charged particle beam apparatus 10 to acquire an SEM observation image of the specimen 104, process the specimen 104 by FIB, and acquire an FIB observation image of the specimen 104. The monitor 106 displays a processing result (for example, an observation image) for the specimen 104 on a screen.

The FIB column 101 includes an ion source, a blanker, an electrostatic deflector, and an electrostatic objective lens. The blanker is used to prevent the ion beam from being irradiated onto the specimen 104 while the FIB column 101 is operated. The electrostatic deflector is for deflecting the ion beam with the lens center of the electrostatic objective lens as a base point and scanning the surface of the specimen 104. As the electrostatic deflector, a single-stage deflector or upper and lower two-stage deflectors can be used.

The SEM column 100 includes an electron gun, a condenser lens, a movable diaphragm, a deflector, and an objective lens. As the electron gun, a filament method, a Schottky method, a field emission method, or the like can be used. As the deflector, a magnetic deflection type or electrostatic deflection type is used. A single-stage deflector or an upper and lower two-stage deflector can be used. As the objective lens, a magnetic lens using an electron focusing action by a magnetic field, an electric field superposition type magnetic lens in which chromatic aberration is reduced by superimposing a magnetic field and an electric field, and the like can be used.

The specimen 104 is mounted on a tiltable specimen stage provided in the specimen chamber 102. When processing the specimen 104 by FIB, the specimen 104 is tilted toward the FIB column 101, and when observing the specimen 104 by SEM, the specimen 104 is tilted toward the SEM column 100. When applying a bias voltage to the specimen 104 during SEM observation, in consideration of the distortion of the electric field formed between the specimen 104 and the SEM column 100, the specimen 104 is disposed so as to be perpendicular to the central axis of the SEM column 100.

The controller 105 scans a primary electron beam generated from the electron gun on the specimen 104 by the deflector, and acquires an SEM observation image by detecting secondary electrons generated from the inside of the specimen 104 with a secondary electron detector (mounted in the SEM column 100 or the specimen chamber 102). The controller 105 processes the specimen 104 by irradiating the specimen 104 with an ion beam from the ion source and acquires an FIB observation image of the specimen 104. The FIB observation image can be acquired by the same method as the SEM observation image.

Figure 2:
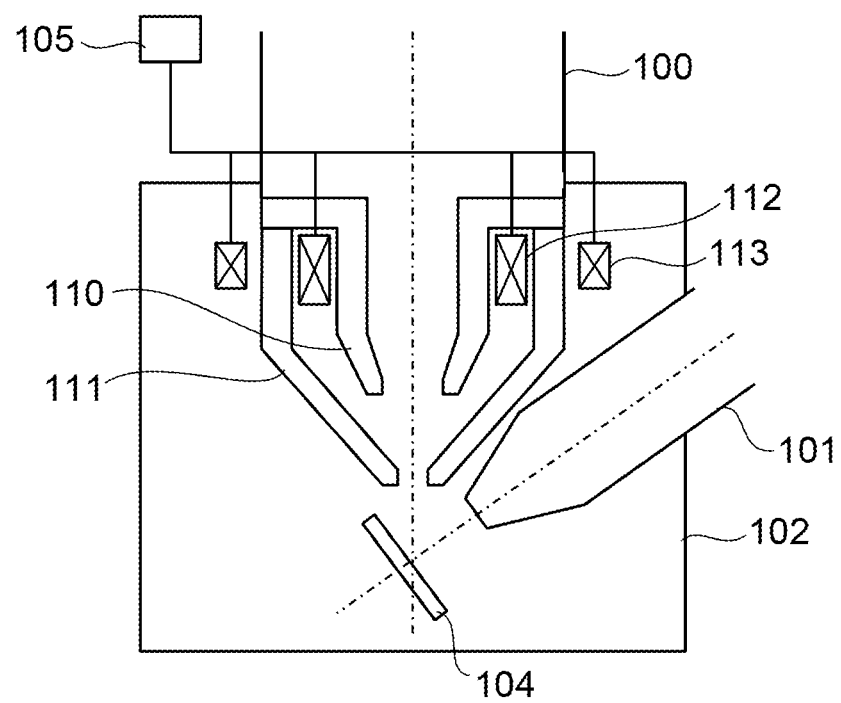
FIG. 2 is a side diagram showing a configuration of an objective lens provided in an SEM column 100.

FIG. 2 is a side diagram showing a configuration of an objective lens provided in the SEM column 100. The objective lens includes a first magnetic pole piece 110, a second magnetic pole piece 111, and a first coil 112. The first magnetic pole piece 110 and the second magnetic pole piece 111 can be formed of a hollow cylindrical magnetic material. The electron beam passes through the hollow part. The first magnetic pole piece 110 and the second magnetic pole piece 111 are formed symmetrically about the electron beam path as the central axis. The second magnetic pole piece 111 is disposed outside the first magnetic pole piece 110 when viewed from the electron beam path. The end of the second magnetic pole piece 111 on the specimen 104 side extends to a position closer to the specimen 104 than the end of the first magnetic pole piece 110 on the specimen 104 side.

The first coil 112 is disposed between the first magnetic pole piece 110 and the second magnetic pole piece 111. The controller 105 adjusts the magnetic flux generated from the first magnetic pole piece 110 and the second magnetic pole piece 111 by controlling the value of the current to be passed to the first coil 112. As a result, the characteristics of the magnetic lens can be controlled.

A second coil 113 is disposed outside the second magnetic pole piece 111 when viewed from the electron beam path (the central axis of each magnetic pole piece). The SEM column 100 may include the second coil 113, or the second coil 113 may be disposed in the specimen chamber 102. The controller 105 controls the value of the current to be passed to the second coil 113, thereby suppressing the leakage magnetic field according to a method described later.

Figure 3:
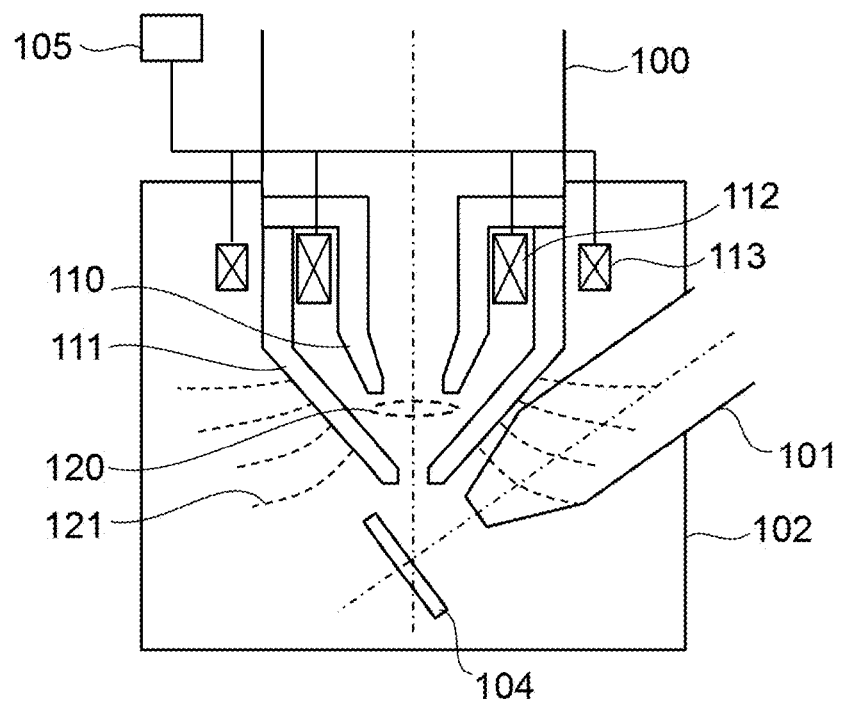
FIG. 3 is a conceptual diagram of a magnetic field generated in the objective lens shown in FIG. 2.

FIG. 3 is a conceptual diagram of a magnetic field generated in the objective lens shown in FIG. 2. In FIG. 3, a non-immersion type magnetic lens 120 having a magnetic field intensity peak in the SEM lens column 100 is illustrated, but an immersion type magnetic lens having a magnetic field intensity peak between the SEM column 100 and the specimen 104, or a lens in which these magnetic lenses are combined can also be used. The non-immersion type magnetic lens is a type of magnetic lens in which the lens is formed inside the SEM lens column 100. The immersion type magnetic lens is a type of magnetic lens in which the lens is formed outside the SEM lens column 100 (specimen 104 side).

The objective lens of the non-immersion type magnetic lens has a small leakage magnetic field 121 with respect to the specimen chamber 102. However, the magnetic field generated inside the specimen chamber 102 due to the objective lens is not completely zero. Therefore, a Lorentz force acts on the ion beam due to the leakage magnetic field, and ions are deflected in a direction orthogonal to the traveling direction of the ion beam and the magnetic flux direction of the magnetic field. As a result, the ion beam is shifted from several nm to several tens of nm on the surface of the specimen 104. Since a single pole lens type objective lens generates a magnetic field in the vicinity of the specimen 104 outside the SEM column 100, the influence of the magnetic field on the ion beam is large, a beam shift of about several hundred µm occurs on the specimen 104, and the resolution deteriorates due to mass separation of ion isotopes occurs. Further, in the case of a single pole lens, even if excitation is turned off, a magnetic field remains in the specimen chamber 102, thus the performance of the ion beam is deteriorated.

Figure 4A:
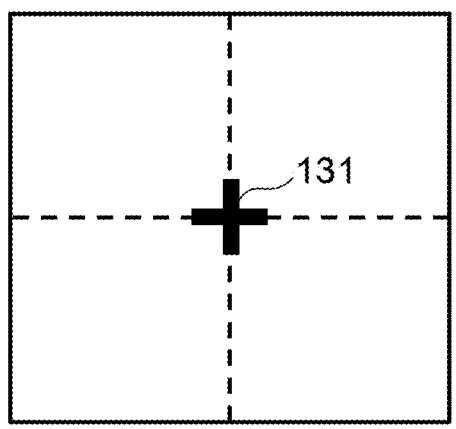
FIGS. 4A and 4B are examples of a positional shift of an FIB observation image.
Figure 4B:
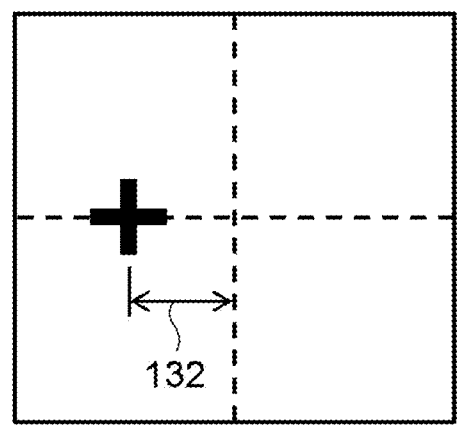

FIG. 4 is an example of a positional shift of the FIB observation image. FIG. 4($a$) is an observation image when the specimen 104 is observed by FIB while passing a first current to the first coil 112. When the specimen 104 is observed by FIB while passing a current to the first coil 112, the position of the observation image is shifted due to the leakage magnetic field generated from the second magnetic pole piece 111. Here, for convenience of description, a reference position 131 when the first current is flowing is disposed in the center of the drawing.

FIG. 4($b$) is an observation image when the specimen 104 is observed by the FIB while passing a second current to the first coil 112. The position of the specimen 104 is the same as that in FIG. 4($a$). As can be seen by comparing FIGS. 4($a$) and 4($b$), since the magnitude of the leakage magnetic field generated in the specimen chamber 102 differs depending on the value of the current that is passed to the first coil 112, the positional shift of the observation image also varies depending on the current value. That is, a difference 132 in the amount of the positional shift occurs between when the first current is passed to the first coil 112 and when the second current is passed. In Embodiment 1, the difference 132 is used to determine the value of the current to be passed to the second coil 113.

FIG. 5 is a flowchart showing a procedure for determining a value of a current to be passed to the second coil 113 in order to suppress a leakage magnetic field. In this flowchart, the steps can be executed by the controller 105 or can be executed manually by an operator. In the following description, it is assumed that the controller 105 performs each step. Hereinafter, each step of FIG. 5 will be described.

(FIG. 5: Step S501)

The controller 105 demagnetizes the magnetic field of the objective lens of the SEM column 100. This step is for enhancing the accuracy of FIB image shift correction performed in the following steps by erasing the magnetic field remaining when the excitation of the SEM objective lens is made zero. For example, a magnetic field generated from the SEM magnetic lens can be canceled by passing a direct current or an alternating current in the direction opposite to that during observation to the first coil 112 or the second coil 113.

(FIG. 5: Steps S502 to S503)

The controller 105 acquires an observation image of the specimen 104 by FIB while passing the first current to the first coil 112 (S502). The controller 105 identifies the amount by which a predetermined reference position is deviated on the observation image, and stores the image shift amount and a first current value on a storage device (S503). For example, the specimen 104 can be observed by FIB in advance before starting this flowchart, and an appropriate position on the observed image can be determined as a reference position.

(FIG. 5: Steps S504 to S506)

The controller 105 stores an FIB image shift amount and a second current value when the second current is passed to the first coil 112 by the same procedure as in steps S501 to S503. At this time, the position of the specimen 104 is the same as in steps S501 to S503.

(FIG. 5: Step S507)

The controller 105 estimates the correspondence between the value of the current that is passed to the first coil 112 and the FIB image shift amount by the method illustrated in FIG. 6. The controller 105 determines a value of a current to be passed to the second coil 113 in order to suppress the FIB image shift according to the estimated correspondence. A specific procedure will be described in conjunction with FIG. 6.

FIG. 6 is a graph showing a correspondence between the current that is passed to the first coil 112 and the FIB image shift amount. It is assumed that points 140 and 141 in FIG. 6(*a*) are observed in steps S503 and S506, respectively. When the correspondence between the current value that is passed to the first coil 112 and the FIB image shift amount is linear, the controller 105 can estimate the correspondence between the two as a function 142.

The controller 105 can estimate a correspondence between the value of a current to be passed to the second coil 113 and the FIB image shift amount in the same manner as in FIG. 6(*a*) by acquiring the FIB observation image while passing a current to the second coil 113 in accordance with the same procedure as steps S501 to S506. The controller 105 can determine a value of a current to be passed to the second coil 113 by using the correspondence estimated for the first coil 112 and the correspondence estimated for the second coil 113. That is, the FIB image shift caused by passing a current to the first coil 112 is estimated, and a current that causes the same amount of FIB image shift in the opposite direction may be passed to the second coil 113.

FIG. 6(*b*) shows an example in which the correspondence between the current to be passed to the first coil 112 and the FIB image shift amount is not linear. In this case, the specimen procedure as steps S501 to S503 is performed three or more times while changing the value of the current to be passed to the first coil 112. For example, it is possible to estimate the correspondence between the current to be passed to the first coil 112 and the FIB image shift amount by further acquiring points 143 and 144 and obtaining a function 145 that connects the points. The same applies to the second coil 113.

Embodiment 1: Summary

The charged particle beam apparatus 10 according to the present Embodiment 1 determines a value of a current to be passed to the second coil 113 based on the difference between the FIB image shift amount when the first current is passed to the first coil 112 and the FIB image shift amount when the second current is passed to the first coil. Thereby, it is possible to suppress the FIB image shift by using the second coil 113 without measuring the leakage magnetic field when a current is passed to the first coil 112. Therefore, since it is not necessary to dispose a magnetic field measuring instrument in the specimen chamber 102, the structure of the specimen chamber 102 (and the charged particle beam apparatus 10 itself) can be simplified.

Embodiment 2

FIG. 7 is a flowchart showing the procedure in which the charged particle beam apparatus 10 according to Embodiment 2 suppresses a leakage magnetic field by passing a current to the second coil 113. The configuration of the charged particle beam apparatus 10 is the same as that of Embodiment 1. Hereinafter, each step of FIG. 7 will be described.

(FIG. 7: Steps S701 to S702)

The controller 105 demagnetizes the magnetic field of the objective lens (S701) and passes the first current to the first coil 112 in the same manner as steps S501 to S502 (S702). As a result, the FIB observation image of the specimen 104 is shifted from the reference position.

(FIG. 7: Step S703)

The controller 105 restores the FIB image shift in step S702 by passing a current to the second coil 113. Specifically, it is possible to restore the image shift by passing a current that causes an image shift in the direction opposite to the image shift by the first coil 112 to the second coil 113 and gradually increasing the value of the current value. It is not always necessary to completely cancel the image shift, and it is sufficient to suppress the image shift to the extent that the image shift falls within an allowable range.

(FIG. 7: Step S704)

The controller 105 stores the first current value in step S702 and the value of the current that is passed to the second coil 113 in step S703 in association with each other.

(FIG. 7: Steps S705 to S708)

The controller 105 specifies the current to be passed to the second coil 113 when the second current is passed to the first coil 112 by the same procedure as steps S701 to S704 and stores these current values in association with each other. At this time, the position of the specimen 104 is the same as in steps S701 to S704.

(FIG. 7: Step S709)

The controller 105 estimates a correspondence between the two based on the value of the current to be passed to the first coil 112 and the value of the current to be passed to the second coil 113, which are stored in steps S704 and S708. As the estimation method, for example, the method described in FIG. 6 can be used. By using this correspondence, if the current value to be passed to the first coil 112 is determined, the current value to be passed to the second coil 113 can be determined in order to suppress the FIB image shift at that time.

Embodiment 2: Summary

The charged particle beam apparatus 10 according to the present Embodiment 2 specifies a current to be passed to the second coil 113 in order to suppress the FIB image shift when the first current is passed to the first coil 112 and further specifies a current to be passed to the second coil 113 in order to suppress the FIB image shift when the second current is passed to the first coil 112. The charged particle beam apparatus 10 further estimates a correspondence between the current to be passed to the first coil 112 and the current to be passed to the second coil 113 according to each current value. That is, since the FIB image shift is directly suppressed, the value of the current to be passed to the second coil 113 can be accurately obtained.

Embodiment 3

Figure 8:
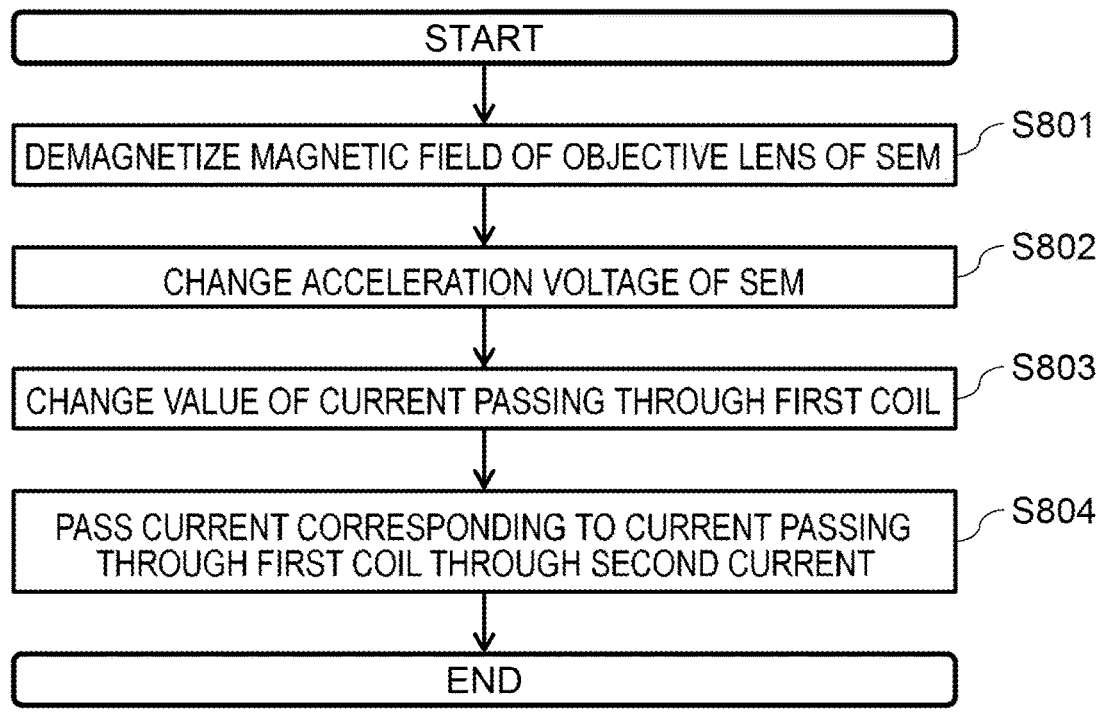
FIG. 8 is a flowchart showing an operation when the charged particle beam apparatus 10 changes an acceleration voltage of the SEM column 100.

FIG. 8 is a flowchart showing an operation when the charged particle beam apparatus 10 changes an acceleration voltage of the SEM column 100. It is assumed that the charged particle beam apparatus 10 has already determined a current to be passed to the second coil 113 in order to suppress the FIB image shift by the procedure described in Embodiments 1 and 2. Hereinafter, each step of FIG. 8 will be described.

(FIG. 8: Steps S801 to S803)

The controller 105 demagnetizes the magnetic field of the objective lens as in step S501 (S801). The controller 105 changes the acceleration voltage of the SEM column 100 (S802). For example, when changing measurement conditions, the acceleration voltage may be changed. If the acceleration voltage changes, the characteristics of the objective lens must be changed accordingly. Therefore, the controller 105 changes the value of the current to be passed to the first coil 112 according to the changed acceleration voltage (S803).

(FIG. 8: Step S804)

The controller 105 determines a value of a current to be passed to the second coil 113 corresponding to the value of a current to be passed to the first coil 112, according to the correspondence specified in advance. The controller 105 suppresses the FIB image shift by passing the current to the second coil 113.

Embodiment 4

Figure 9:
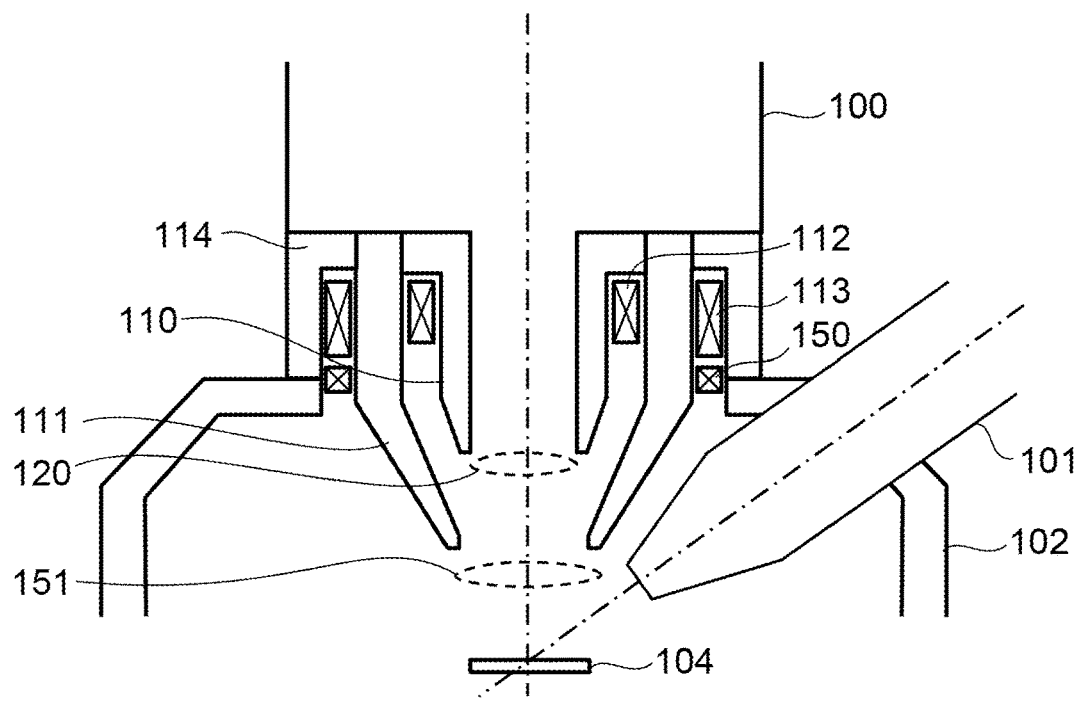
FIG. 9 is a configuration diagram of an objective lens of the SEM column 100 provided in the charged particle beam apparatus 10 according to Embodiment 4.

FIG. 9 is a configuration diagram of an objective lens of the SEM column 100 provided in the charged particle beam apparatus 10 according to Embodiment 4 of the present invention. The charged particle beam apparatus 10 according to Embodiment 4 includes a third coil 150 and a third magnetic pole piece 114 in addition to the configurations described in Embodiments 1 and 2.

The first coil 112 is placed between the first magnetic pole piece 110 and the second magnetic pole piece 111, and forms the non-immersion type magnetic lens 120 having a magnetic field intensity peak in the SEM column 100. The second coil 113 is placed outside the second magnetic pole piece 111, and forms an immersion type magnetic lens 151 having a magnetic field intensity peak between the SEM column 100 and the specimen 104.

The third magnetic pole piece 114 is disposed outside the second magnetic pole piece 111 when viewed from the electron beam path. The second magnetic pole piece 111 and the third magnetic pole piece 114 form a magnetic path surrounding the second coil 113. As a result, the second coil 113 has a stronger function of forming a magnetic lens as compared with the configuration described in Embodiment 1.

The third coil 150 is disposed outside the second magnetic pole piece 111, and is used to suppress the FIB image shift. As the third coil 150, as compared with the first coil 112 and the second coil 113, a coil having a small number of turns of the coil wire can be used. The current that is passed to the third coil 150 to suppress the FIB image shift can be determined by the same method as in Embodiments 1 and 2. The third coil 150 can be configured as a part of the SEM column 100 or can be disposed in the specimen chamber 102.

The second coil 113 can be used to form a magnetic lens, and can be used to suppress the FIB image shift as in Embodiments 1 to 3. For example, the FIB image shift that occurs when a non-immersion type magnetic lens is formed by the first coil 112 can be suppressed by the second coil 113 or can be suppressed by the third coil 150.

In Embodiment 4, the second coil 113 has both the role of forming a magnetic lens and the role of suppressing the leakage magnetic field, and thus has the largest number of turns among the three coils. That is, the number of second coil turns the number of first coil turns the number of third coil turns. On the other hand, in Embodiment 1, the second coil 113 is used to suppress the leakage magnetic field, and therefore has fewer turns than the first coil 112. That is, the first coil turns the second coil turns.

Figure 10:
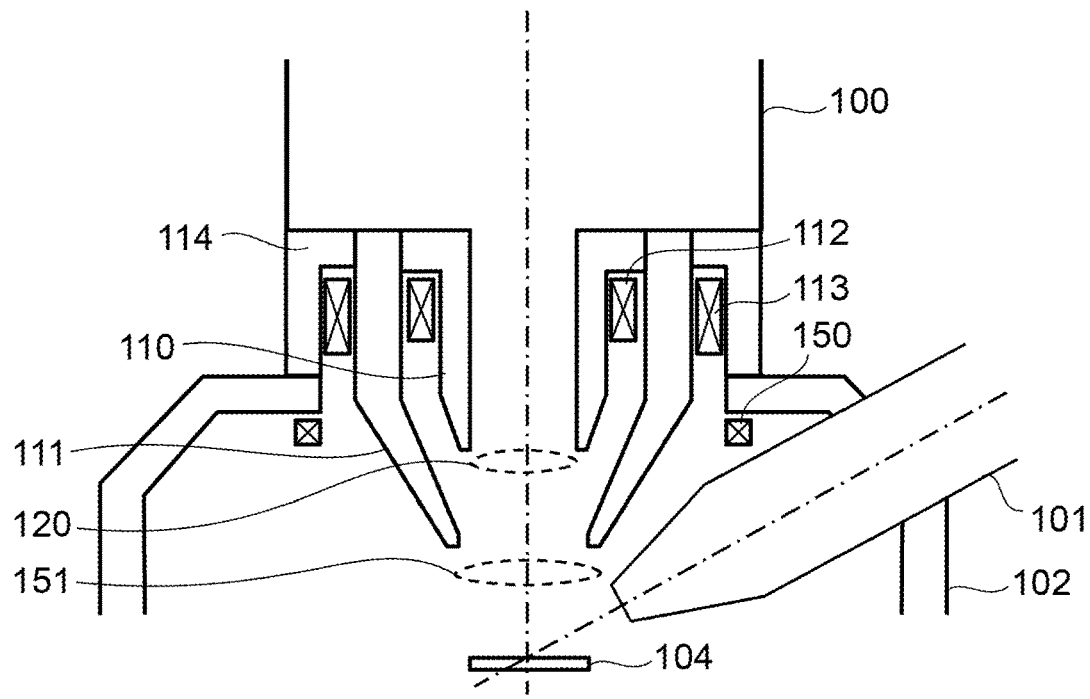
FIG. 10 is a modification example of FIG. 9.

FIG. 10 is a modification example of FIG. 9. The third coil 150 can be configured as a part of the SEM column 100 as shown in FIG. 9, or can be disposed in the specimen chamber 102 as shown in FIG. 10.

Embodiment 5

Figure 11:
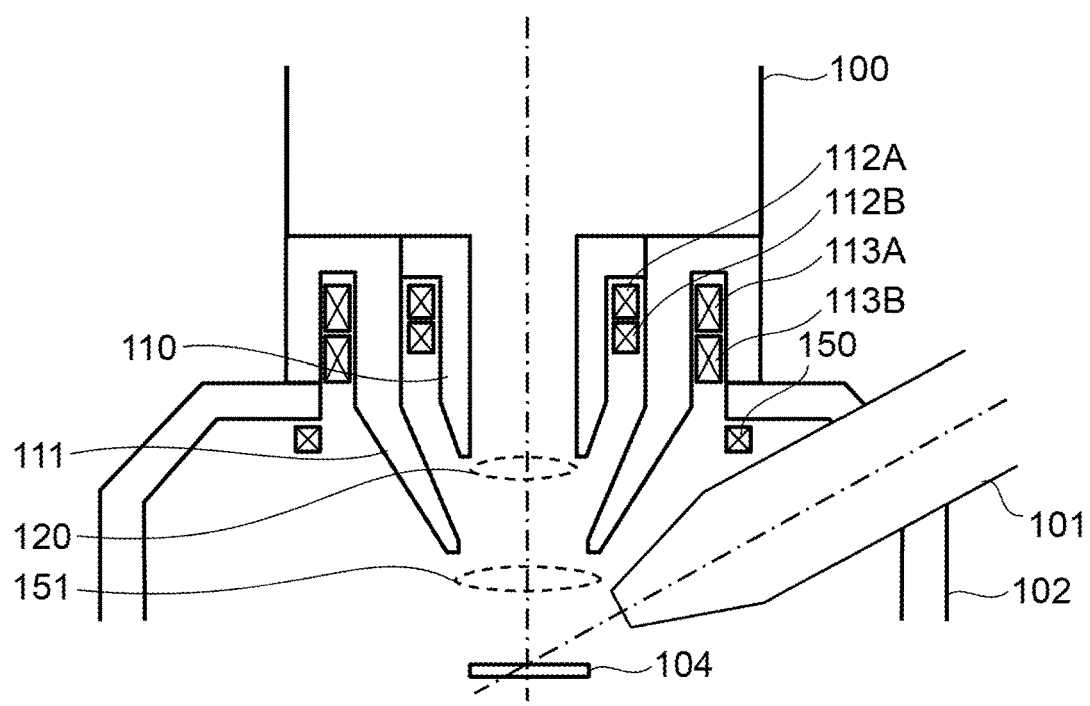
FIG. 11 is a configuration diagram of an objective lens of the SEM column 100 provided in the charged particle beam apparatus 10 according to Embodiment 5.

FIG. 11 is a configuration diagram of an objective lens of the SEM column 100 provided in the charged particle beam apparatus 10 according to Embodiment 5 of the present invention. Either one or both of the first coil 112 and the second coil 113 can be divided into a plurality of coils. FIG. 11 shows an example in which both the first coil 112 and the second coil 113 are divided into two coils.

In order to stabilize the magnetic field generated from the pole piece, it is important to suppress the temperature change of the pole piece. In order to suppress the temperature change of the pole piece, the power consumption of the coil may be kept constant. In order to adjust the magnetic field while keeping the power consumption of the coil constant, it is only necessary to change the direction of the current of each divided coil while keeping the magnitude of the current that is passed to the coil constant. For example, in FIG. 11, the generated magnetic field can be canceled by passing currents in opposite directions to coils 112A and 112B. When a magnetic field is generated, currents in the same direction or currents having different magnitudes in the opposite direction may be passed to the coils 112A and 112B. In either case, the power consumption can be kept constant by keeping the current value constant.

The number of turns of each divided coil may be the same or different. The current control can be simplified if the number of turns is the same. The performance as a coil is the same for both a divided coil and a single coil.

Modification Example of Present Invention

The present invention is not limited to the above-described embodiments, and includes various modification examples. For example, the above-described embodiments have been described in detail for easy understanding of the present invention, and are not necessarily limited to those having all the configurations described. A part of the configuration of one example can be replaced with the configuration of another example, and the configuration of another example can be added to the configuration of one example. It is possible to add, delete, and replace other configurations for a part of the configuration of each example.

As one application of the FIB-SEM apparatus, there is a mode (hereinafter, referred to as "CutAndSee") in which a specimen is analyzed three-dimensionally by quickly and alternately repeating FIB processing and SEM observation. By using the present invention in this CutAndSee, more accurate analysis can be realized. In CutAndSee, the specimen height during SEM observation changes as FIB processing is repeated. Therefore, it is necessary to adjust the focus of the SEM column 100 during analysis. At this time, since the magnetic field of the SEM objective lens in the specimen chamber 102 changes minutely and the FIB shifts, the processing accuracy by the FIB is deteriorated. Therefore, the influence of the magnetic field of the SEM objective lens is suppressed by the second coil 113 or the third coil 150 during CutAndSee. Thereby, it is possible to improve the processing accuracy of FIB.

Figure 12:
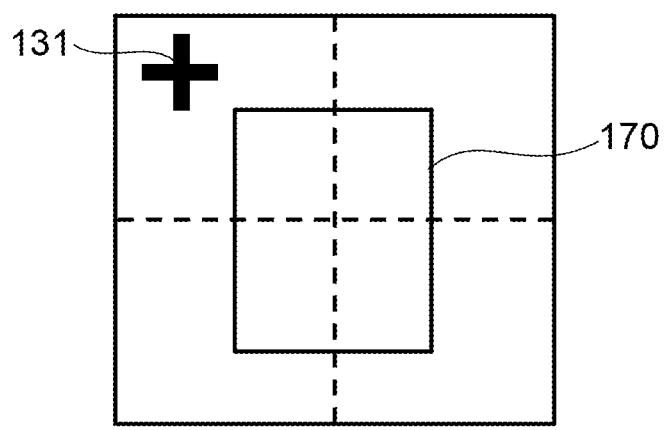
FIG. 12 is an example of an FIB observation image when CutAndSee is performed.

FIG. 12 is an example of an FIB observation image when CutAndSee is performed. An area 170 is an area processed by FIB. It is possible to improve the processing accuracy by correcting the deviation of the reference position 131, for example, every time the CutAndSee processing is performed several times.

In the above embodiments, the controller 105 can be configured by using hardware such as a circuit device that implements the function, or can be configured by an arithmetic unit executing software that implements the function.

REFERENCE SIGNS LIST

10: charged particle beam apparatus
100: SEM column
101: FIB column
102: specimen chamber
103: FIB-SEM frame
104: specimen
105: controller
106: monitor
110: first pole piece
111: second pole piece
112: first coil
113: second coil
114: third pole piece
150: third coil

The invention claimed is:

1. A charged particle beam apparatus for irradiating a specimen with a charged particle beam, the apparatus comprising:
an ion beam irradiation unit that emits a focused ion beam to the specimen;
an electron beam irradiation unit that emits an electron beam to the specimen;
an objective lens for focusing the electron beam on the specimen; and
a control unit that controls the objective lens,
wherein the objective lens includes
a first magnetic pole piece,
a second magnetic pole piece that is disposed at a position further away from the electron beam path with respect to the first magnetic pole piece, and
a first coil that is disposed between the first magnetic pole piece and the second magnetic pole piece,
the charged particle beam apparatus further includes
a second coil that is disposed at a position further away from the electron beam path with respect to the second magnetic pole piece,
the control unit performs
a first operation of acquiring an observation image of the specimen by the focused ion beam while passing a first current to the first coil, and
a second operation of acquiring the observation image of the specimen by the focused ion beam while passing a second current to the first coil after disposing a position of the specimen at the same position as the first operation,
the control unit passes a correction current to the second coil to generate a magnetic field that reduces a positional shift of the observation image caused by passing a current to the first coil, and
the control unit determines the correction current based on a difference between the first operation and the second operation.

2. The charged particle beam apparatus according to claim 1, wherein
the control unit acquires a first shift amount between the first observation image of the specimen when the first current is passed to the first coil and the second observation image of the specimen when the second current is passed to the first coil, as the difference, and
the control unit determines the correction current based on the first shift amount.

3. The charged particle beam apparatus according to claim 2, wherein
the control unit estimates a first correspondence between the current to be passed to the first coil and the first shift amount, based on the first current, the second current, and the first shift amount, and
the control unit determines the correction current corresponding to the current to be passed to the first coil according to the estimated first correspondence.

4. The charged particle beam apparatus according to claim 2, wherein
the control unit acquires a second shift amount between a third observation image of the specimen when a third current is passed to the second coil and a fourth observation image of the specimen when a fourth current is passed to the second coil,
the control unit estimates a second correspondence between the current to be passed to the second coil and the second shift amount, based on the third current, the fourth current, and the second shift amount, and the control unit determines the correction current so as to reduce the first shift amount according to the estimated second correspondence.

5. The charged particle beam apparatus according to claim 2, wherein
the control unit passes a plurality of different currents to the first coil, and acquires an observation image of the specimen by the focused ion beam while passing each of the currents,
the control unit estimates a correspondence between a current to be passed to the first coil and a shift amount of the observation image, and
the control unit determines the correction current corresponding to a current to be passed to the first coil in according to the estimated correspondence.

6. The charged particle beam apparatus according to claim 1, wherein
the control unit reduces a positional shift of an observation image of the specimen acquired by the focused ion beam while passing the first current to the first coil by passing a first correction current to the second coil,
the control unit reduces a positional shift of an observation image of the specimen acquired by the focused ion beam while passing the second current to the first coil by passing a second correction current to the second coil,
the control unit acquires a third shift amount between the first correction current and the second correction current, as the difference, and
the control unit determines the correction current corresponding to a current to be passed to the first coil, based on the third shift amount.

7. The charged particle beam apparatus according to claim 6, wherein
the control unit estimates a third correspondence between a current to be passed to the first coil and the correction current, based on the first current, the second current, and the third shift amount, and
the control unit determines the correction current corresponding to the current to be passed to the first coil according to the estimated third correspondence.

8. The charged particle beam apparatus according to claim 1, wherein
when an acceleration voltage used when the electron beam irradiation unit emits the electron beam is changed, the control unit determines a current to be passed to the first coil under the changed acceleration voltage, and
the control unit determines the correction current corresponding to a current to be passed to the first coil under the changed acceleration voltage.

9. The charged particle beam apparatus according to claim 1, further comprising:
a third coil that is disposed at a position away from the electron beam path with respect to the second magnetic pole piece, wherein
the control unit passes a third correction current to the third coil to generate a magnetic field that reduces a positional shift of the observation image caused by passing a current to the first coil, and
the control unit determines the third correction current based on a difference between the first operation and the second operation.

10. The charged particle beam apparatus according to claim 9, further comprising:
a third magnetic pole piece that is disposed at a position away from the electron beam path with respect to the second coil,
wherein the second magnetic pole piece and the third magnetic pole piece form a magnetic path surrounding the second coil.

11. The charged particle beam apparatus according to claim 1,
wherein at least one of the first coil and the second coil is formed by a plurality of coils.

12. The charged particle beam apparatus according to claim 9, wherein
the number of turns of the second coil is equal to or greater than the number of turns of the first coil, and
the number of turns of the first coil is equal to or greater than the number of turns of the third coil.

13. The charged particle beam apparatus according to claim 1,
wherein the number of turns of the first coil is equal to or greater than the number of turns of the second coil.

* * * * *